United States Patent
Abe

(10) Patent No.: US 7,122,447 B2
(45) Date of Patent: Oct. 17, 2006

(54) FABRICATION METHOD OF SEMICONDUCTOR CIRCUIT DEVICE

(75) Inventor: Yoshiyuki Abe, Hinode (JP)

(73) Assignee: Renesas Technology Corp., Tokyo (JP)

( * ) Notice: Subject to any disclaimer, the term of this patent is extended or adjusted under 35 U.S.C. 154(b) by 82 days.

(21) Appl. No.: 10/688,992

(22) Filed: Oct. 21, 2003

(65) Prior Publication Data

US 2004/0097054 A1    May 20, 2004

(30) Foreign Application Priority Data

Oct. 25, 2002    (JP) ............................. 2002-310787

(51) Int. Cl.
  *H01L 21/46*    (2006.01)
(52) U.S. Cl. ........................ 438/460; 438/459; 438/458
(58) Field of Classification Search ................ 438/460, 438/459, 458
  See application file for complete search history.

(56) References Cited

U.S. PATENT DOCUMENTS

2004/0097054 A1* 5/2004 Abe ............................ 438/460
2005/0233547 A1* 10/2005 Noda et al. .................. 438/459

FOREIGN PATENT DOCUMENTS

| JP | 7-22358 | 1/1995 |
| JP | 8-181197 | 7/1996 |
| JP | 08181197 A | * 7/1996 |
| JP | 10-112494 | 4/1998 |
| JP | 2002-26039 | 1/2002 |

OTHER PUBLICATIONS 2002-026039 Patent Publication, Takahiro; Computer Generated English Translation by JPOABS.*

* cited by examiner

*Primary Examiner*—Laura M. Schillinger
(74) *Attorney, Agent, or Firm*—Antonelli, Terry, Stout and Kraus, LLP.

(57) ABSTRACT

When a semiconductor wafer is formed to be thin, steps need to be taken to prevent warping of the wafer. For this purpose, a protective tape is affixed to a surface of the semiconductor wafer, and a back side of the semiconductor wafer is then ground to a predetermined thickness. A die bonding film is affixed to the back side of the semiconductor wafer, and a dicing tape is affixed on the die bonding film. The dicing tape that is affixed to the semiconductor wafer is held by a holding jig. The protective tape is peeled off from the wafer surface, and the die bonding film is heated to improve the adherence between the semiconductor wafer and the die bonding film. The semiconductor wafer is subjected to dicing for separation into individual semiconductor chips. The semiconductor chips are then die-bonded in a predetermined number onto a wiring substrate to fabricate a semiconductor device.

20 Claims, 12 Drawing Sheets

FABRICATION METHOD OF SEMICONDUCTOR CIRCUIT DEVICE

BACKGROUND OF THE INVENTION

The present invention relates to a semiconductor device fabricating technique; and, more particularly the invention relates to a technique which is applicable to semiconductor device manufacture in which an adhesive sheet is affixed to a wafer.

Japanese Unexamined Patent Publication No. Hei 10(1998)-112494 describes a technique in which an adhesive sheet for die bonding is affixed to a semiconductor wafer. According to the technique disclosed therein, the affixing of the adhesive sheet to the semiconductor wafer is performed after peeling off a release film from the adhesive sheet, and the adhesive sheet portion affixed to an outer periphery portion of the semiconductor wafer is cut off (see Patent Literature 1).

Japanese Unexamined Patent Publication No. 2002-26039 discloses a technique in which a protective tape for back grinding is affixed to a surface of a wafer; then, after back grinding, an adhesive tape for die bonding is affixed to a back side of the wafer with the protective tape for back grinding affixed thereto; thereafter, the protective tape for back grinding is peeled off; followed by probing; then, a protective film for dicing is affixed to the adhesive tape for die bonding; followed by dicing and subsequent die bonding with use of the adhesive tape for die bonding (see Patent Literature 2).

Japanese Unexamined Patent Publication No. Hei 8(1996)-181197 discloses a technique in which a protective tape is affixed to a surface of a wafer; then, a back side of the wafer with the protective tape affixed thereto is subjected to grinding; thereafter, a dicing tape is affixed to the back side of the wafer with the protective tape affixed thereto, and a holding jig for holding the dicing tape is affixed to an around-the-wafer portion of the dicing tape with the wafer affixed thereto; followed by dicing (see Patent Literature 3).

In Japanese Unexamined Patent Publication No. Hei 7 (1995)-22358 discloses a technique wherein a tape for protection and reinforcement is affixed to a surface of a wafer; then, in this state, a back side of the wafer is subjected to grinding and is then affixed to a dicing tape; thereafter, the tape for protection and reinforcement is peeled off and dicing is performed (see Patent Literature 4).

[Patent Literature 1]
Japanese Unexamined Patent Publication No. Hei 10(1998)-112494
[Patent Literature 2]
Japanese Unexamined Patent Publication No. 2002-26039
[Patent Literature 3]
Japanese Unexamined Patent Publication No. Hei 8(1996)-181197
[Patent Literature 4]
Japanese Unexamined Patent Publication No. Hei 7(1995)-22358

SUMMARY OF THE INVENTION

If the thickness of a semiconductor wafer is made small for the purpose of fabricating a thin semiconductor device, it becomes easier for the semiconductor wafer to warp and easier to crack or chip during manufacture or conveyance between manufacturing steps, with consequent lowering of the semiconductor device manufacturing yield and increase of the semiconductor device manufacturing cost.

According to the method wherein an adhesive sheet is affixed to a semiconductor wafer after peel-off of the release film, there arises a problem in that, at the time of affixing the adhesive sheet to the wafer, the affixed adhesive sheet is apt to wrinkle due to, for example, an ill-tension balance of the adhesive sheet. Once the adhesive sheet is wrinkled, re-affixing of the adhesive sheet is difficult; and, therefore, it is necessary to take off the semiconductor wafer, which is considered as being defective, thus causing a remarkable increase in the semiconductor device manufacturing cost.

According to the method wherein the protective tape for dicing is affixed onto the adhesive tape for die bonding after peel-off of the protective tape for back grinding from the wafer, only the adhesive tape for die bonding is present on the wafer, with consequent fear of the wafer becoming warped before or during affixing of the protective tape for dicing. Once the semiconductor wafer warps, it becomes easier for the wafer to be cracked or chipped during manufacture of the semiconductor device or during conveyance between manufacturing steps. It also becomes easier for the wafer to become flawed. The occurrence of such a flaw results in a lowering of the semiconductor device manufacturing yield and an increase in the semiconductor device manufacturing cost.

According to the method wherein the adhesive layer for die bonding is not formed on the wafer, but a dicing tape is affixed to the wafer, it is necessary for the semiconductor chip be subjected to die bonding with use of silver paste or the like, with the result that the manufacturing process becomes complicated and the semiconductor device manufacturing cost increases.

It is an object of the present invention to provide a semiconductor device fabricating method that is capable of preventing warping of a wafer.

It is another object of the present invention to provide a semiconductor device manufacturing method that is capable of reducing the semiconductor device manufacturing cost.

The above and other objects and novel features of the present invention will become more apparent from the following description and the accompanying drawings.

Typical modes of the present invention disclosed herein will be outlined below.

A semiconductor device manufacturing method according to the present invention comprises affixing a protective tape to a first surface of a wafer, grinding a second surface of the wafer located on the side opposite to the first surface, affixing a die bonding film to the second surface of the wafer, affixing a dicing tape onto the die bonding film on the second surface of the wafer, peeling off the protective tape from the first surface of the wafer, and dicing the wafer.

Thus, the dicing tape is affixed to the wafer in a state wherein the protective sheet for back grinding is affixed to the wafer to prevent warping, etc. of the wafer.

Further, in a semiconductor device fabricating method according to the present invention, a laminate of a die bonding film and a separator film is affixed to the back side of a wafer in such a manner that the die bonding film faces inside; and then, the separator film is peeled off, and the die bonding film is cut off along the outer periphery of the wafer.

By peeling off the separator film after affixing the die bonding film together with the separator film to the back side of the wafer, the separator film is prevented from becoming wrinkled.

DETAILED DESCRIPTION OF THE PREFERRED EMBODIMENTS

Figure 1:
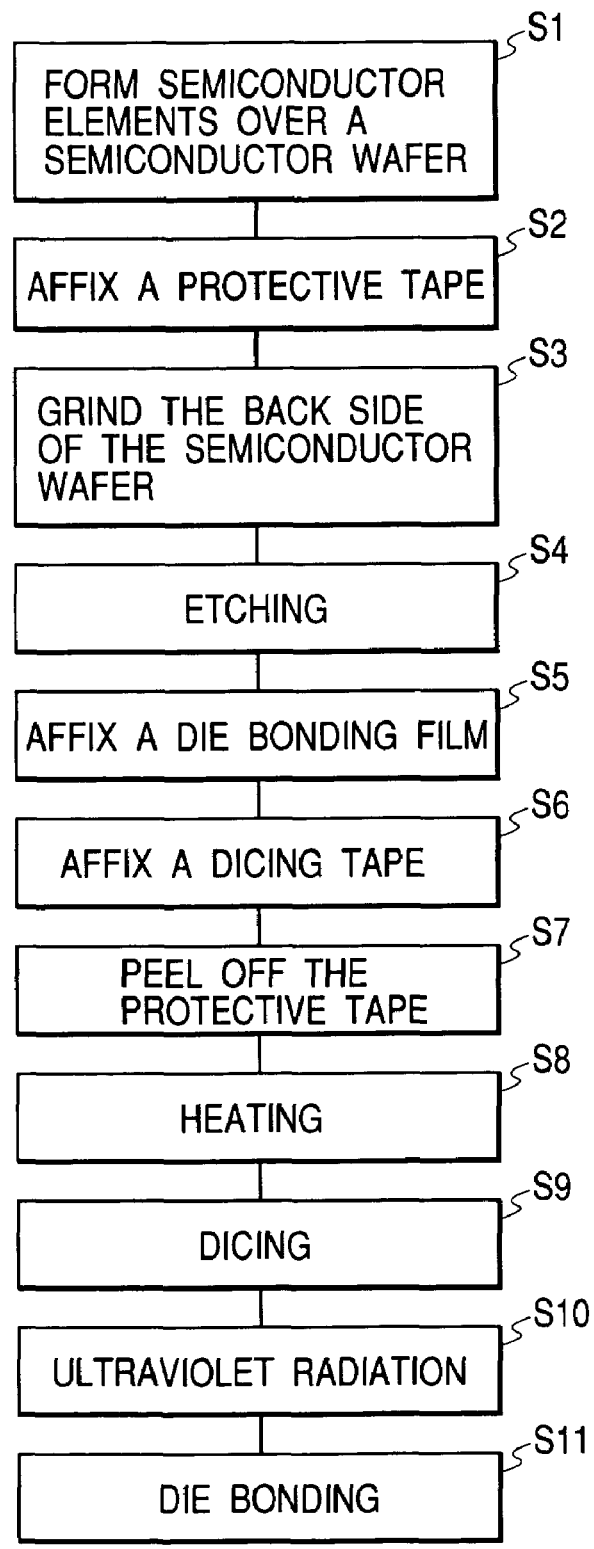
FIG. 1 is a process flow chart showing a semiconductor device manufacturing process according to an embodiment of the present invention.

Prior to describing the present invention in detail, the meanings of terms used herein will be explained.

1. When mention is made of a substance name such as, for example, PET (polyethylene terephthalate), it is to be understood that not only the substance referred, to but also those materials containing the substance referred to (e.g., element, atomic group, molecule, polymer, copolymer, or compound) as a principal component or a composition component are included unless otherwise mentioned.

For example, when reference is made to a silicon region, there are included a pure silicon region, a region containing an impurity-doped silicon as a principal component, and a mixed crystal region containing silicon as a principal component, such as GeSi, unless otherwise mentioned. When reference is made to MOS, "M" is not limited to the pure metal, but there are also included a polysilicon (including an amorphous one) electrode, a silicide layer, and other members exhibiting metal-like properties, unless otherwise mentioned. Further, when reference is made to MOS, "O" is not limited to an oxide film, such as a silicon oxide film, but there are also included a nitride film, a oxy-nitride film, an alumina film, and other normal dielectric, high dielectric and ferroelectric films, unless otherwise mentioned.

2. As examples of a wafer, there are included silicon and other semiconductor single crystal substrates (generally disk-like ones, a semiconductor wafer, semiconductor chips and pellets obtained by dividing them into unit integrated circuit regions, as well as their base regions) such as used in fabricating a semiconductor integrated circuit, a sapphire substrate, a glass substrate, other insulating, semi-insulating or semiconductor substrates, and composite substrates thereof.

The following embodiments will be described dividedly in plural sections or embodiments where required for the sake of convenience; and, unless otherwise mentioned, it is to be understood that they are not unrelated to each other, but one is in a relation of modification or a detailed or supplementary explanation of part or the whole of the other.

When reference is made, for example, to the number of elements (including the number of pieces, numerical value, quantity, and range) in the following embodiments, no limitation is made to the specified number, but numbers above and below the specified number will do, unless otherwise specified, and except in the case where a limitation is made to the specified number basically clearly.

In the following embodiments, moreover, it goes without saying that their components (including constituent steps) are not always essential, unless otherwise mentioned, and except in the case where they are considered essential basically clearly.

Likewise, in the following embodiments, it is to be understood that when reference is made to the shape and positional relation of a component, those arrangements substantially similar or closely similar thereto are also included unless otherwise mentioned, and except in the case where the answer is negative basically clearly. This is also true of the foregoing numerical value and range.

In all of the drawings, portions having the same functions are identified by like reference numerals, and repeated explanations thereof will be omitted. Further, in the drawings, even plan views may be hatched to make them easier to see.

Embodiments of the present invention will be described in detail hereinunder with reference to the accompanying drawings.

Figure 2:
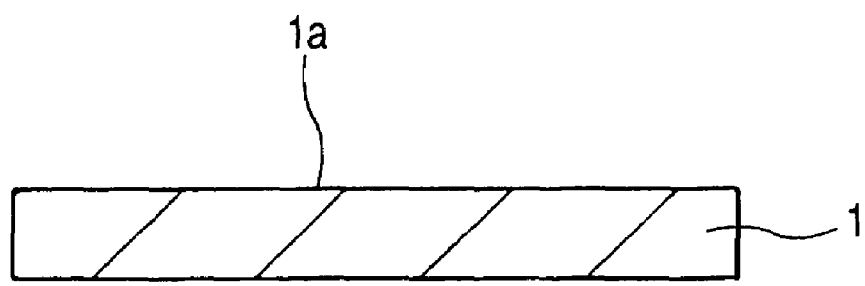
FIG. 2 is a sectional view of a step in the semiconductor device manufacturing process.
Figure 3:
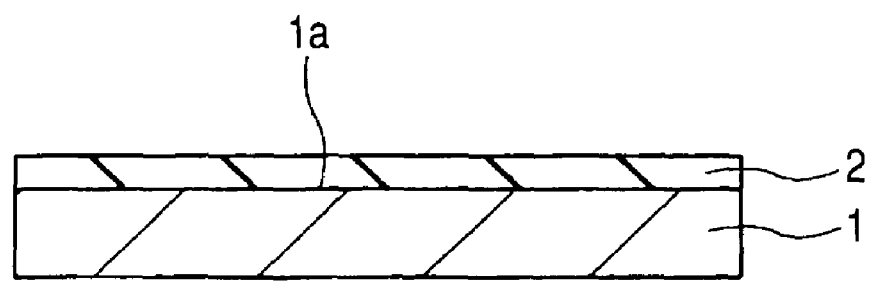
FIG. 3 is a sectional view of a step in the semiconductor device manufacturing process which follows the step of FIG. 2.

FIG. 1 is a process flow chart showing a process for fabricating a semiconductor device (semiconductor integrated circuit device) according to an embodiment of the present invention. FIGS. 2 and 3 are sectional views of steps in the semiconductor device manufacturing process of this embodiment.

First, as shown in FIG. 2, there is provided a wafer (a semiconductor substrate for fabricating a semiconductor integrated circuit) formed of single crystal silicon, for example, or a semiconductor substrate 1. Then, plural semiconductor elements, e.g., MOSFETs (Metal Oxide Semiconductor Field Effect Transistors), are formed on the semiconductor wafer 1 in accordance with a known semiconductor device manufacturing technique (step S1). The semiconductor elements formed on the semiconductor wafer 1 are not limited to MOSFETs, but various other semiconductor elements may be formed thereon.

Next, as shown in FIG. 3, a protective tape (BG sheet, protective sheet) 2 for back grinding is affixed to a surface (a main surface on the semiconductor element side of the semiconductor wafer 1: a first face) of the semiconductor wafer 1 (step S2). In a back grinding (BG: back grinding) step for the semiconductor wafer 1, to be described later, the protective tape 2 functions to protect the surface 1a of the semiconductor wafer 1 or protect the semiconductor elements formed thereon and prevent warping of the semiconductor wafer 1, which becomes thinner as a result of the back grinding. It suffices for the protective tape 2 to have a sufficient degree of strength to prevent warping of the semiconductor wafer 1 at room temperature. One face of the protective tape 2 has a stickiness (adhesion) and the protective tape 2 is affixed to the wafer so that its sticky face (sticky or adhesive face) comes into contact with the surface 1a of the wafer 1. The protective tape 2 can be formed using any of various materials, e.g., a laminate of PET (polyethylene terephthalate) and EVA (ethylene-vinyl acetate copolymer), or vinyl chloride.

Figure 4:
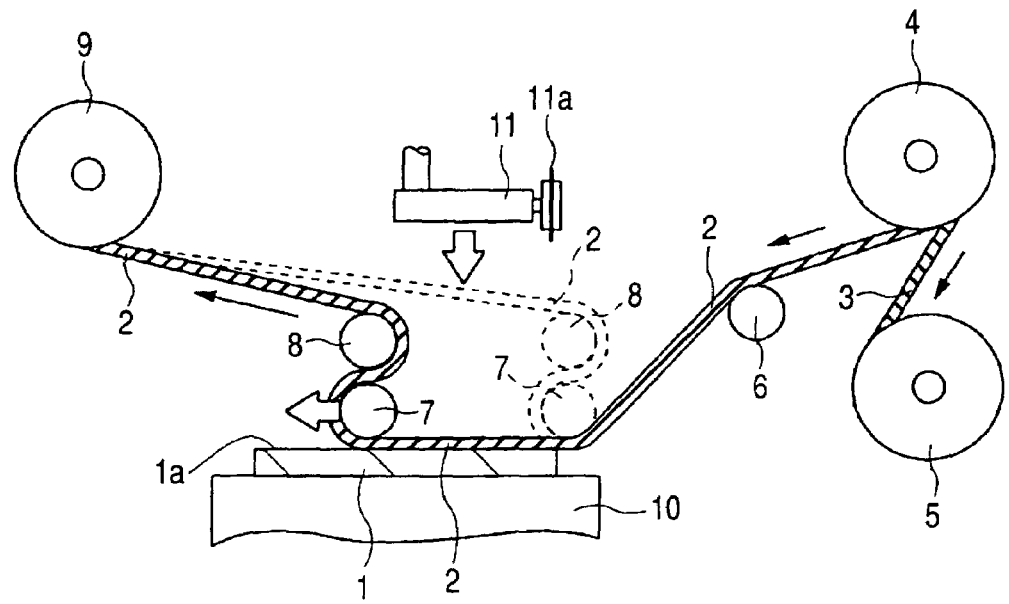
FIG. 4 is a diagram which illustrates a step of affixing a protective tape to a semiconductor wafer.
Figure 5:
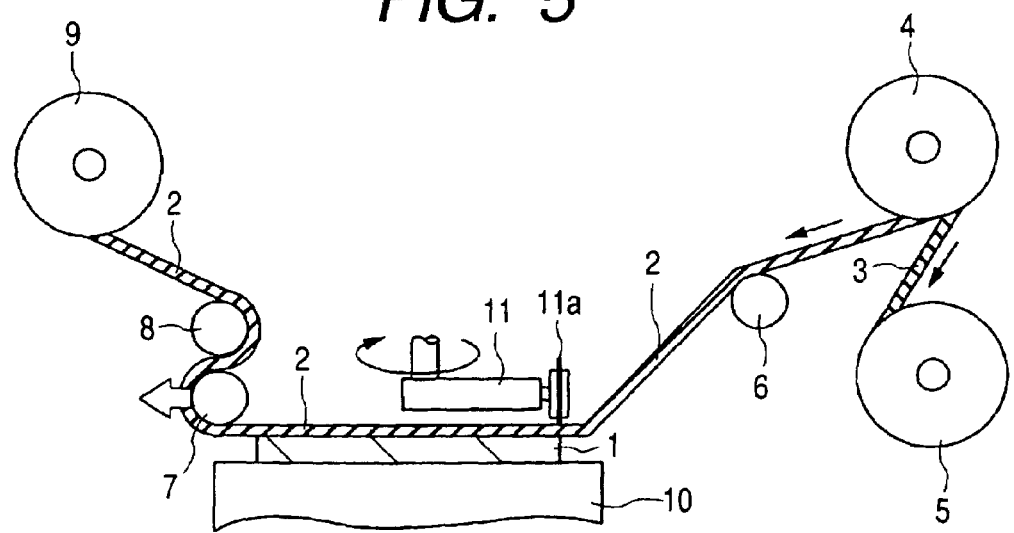
FIG. 5 is a diagram which illustrates a step in the semiconductor device manufacturing process which follows the step of FIG. 4.
Figure 6:
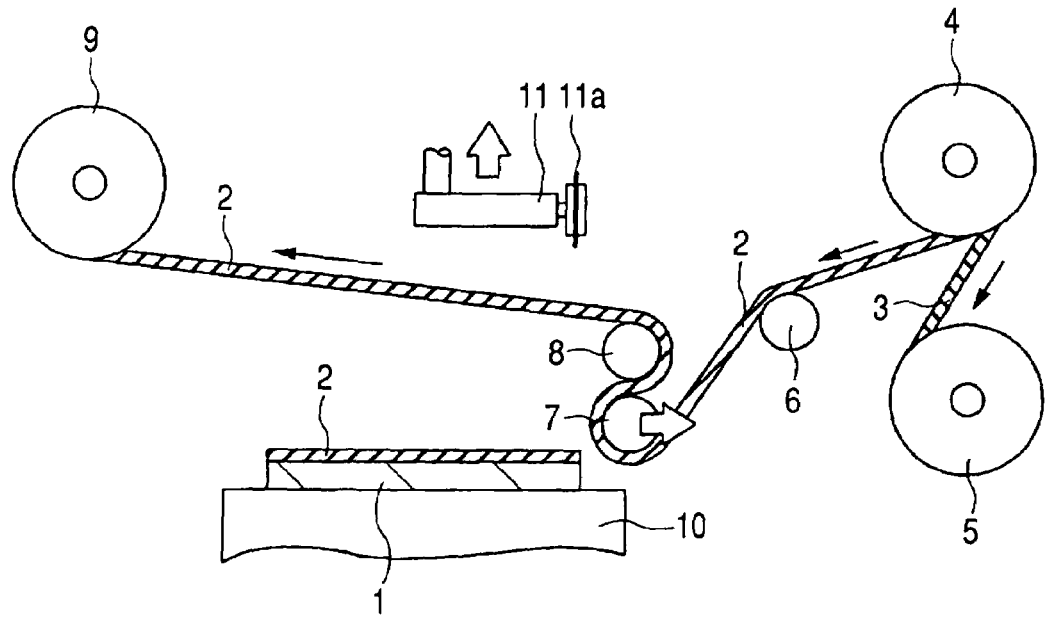
FIG. 6 is a diagram which illustrates a step in the semiconductor device manufacturing process which follows the step of FIG. 5.

FIGS. 4 to 6 illustrate steps of affixing the protective tape 2 to the semiconductor wafer 1.

As shown in FIG. 4, a delivery roll 4 carries a protective tape 2 on which a separator or a separator film 3 is affixed (laminated) to the sticky face of the protective tape 2; and, in this state, the protective tape 2 is wound round the protective tape delivery roll 4. The separator film 3 is peeled-off and fed from the protective tape delivery roll 4 to a take-up roll 5 and is wound round the take-up roll. The protective tape 2, after peel-off of the separator film 3 therefrom, is fed to and wound round a protective tape take-up roll 9 after passing through rollers 6, 7, and 8. The rollers 7 and 8 are constructed so as to be movable laterally (in a direction parallel to the main surface of the semiconductor wafer 1), as seen in FIG. 4. The rollers 7 and 8 move laterally while pressing down the protective tape 2 onto the semiconductor wafer 1 disposed on a table 10 (disposed in such a manner that the surface 1a side of the wafer faces upward), thereby affixing the protective tape 2 onto the wafer surface 1a. Subsequently, a sheet cutter 11 moves down to above the semiconductor wafer 1 and, as shown in FIG. 5, cuts the protective tape 2 along an outer periphery (contour) of the wafer 1 with use of a blade 11a of the sheet cutter 11. At this time, the sheet cutter 11 rotates, whereby the blade 11a of the sheet cutter 11 moves along the entire outer periphery of the wafer 1 and cuts a portion of the protective tape 2 along the outer periphery of the wafer 1. Thereafter, the sheet cutter 11 moves up, and, as shown in FIG. 6, the rollers 7 and 8 move laterally, so that the remaining portion of the protective tape 2, other than the portion thereof that is bonded to the semiconductor wafer 1 (the protective tape 2 in a gouged-out state missing the portion bonded to the wafer 1), is separated from the wafer 1 and is wound up onto the protective tape take-up roll 9. As a result, the portion of the protective tape 2 remains affixed (bonded) onto the surface 1a of the semiconductor wafer 1.

Figure 7:
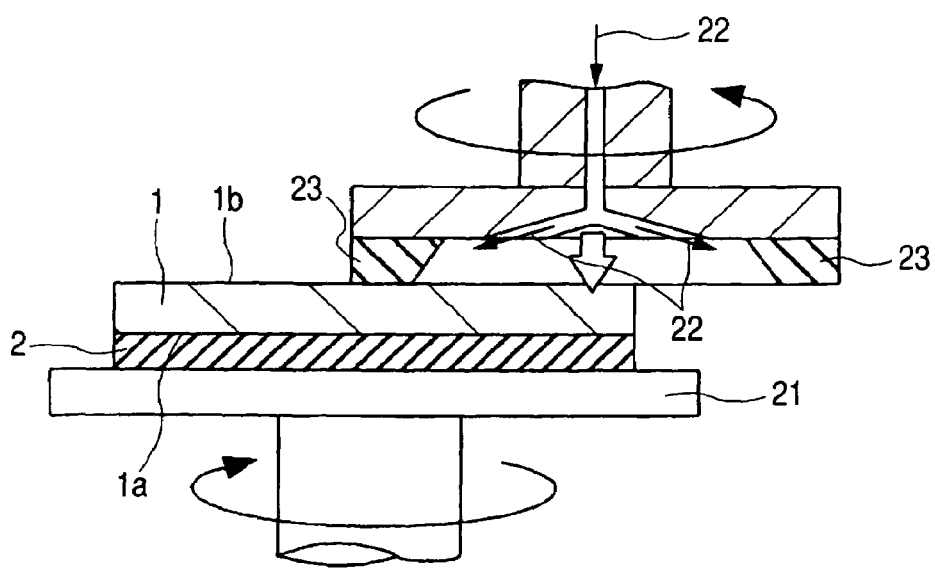
FIG. 7 is a diagram illustrates a back grinding step for the semiconductor wafer.

After the protective tape 2 is thus affixed onto the surface (first face) 1a of the semiconductor wafer 1, the opposite side to the surface 1a of the wafer 1, i.e., the back side (a second face) 1b is subjected to grinding (step S3), thereby reducing the thickness of the semiconductor wafer 1. FIG. 7 is a diagram showing the back grinding step for the semiconductor wafer 1.

As shown in FIG. 7, the surface 1a side of the semiconductor wafer 1, with the protective tape 2 affixed thereto, is held by a BG chuck table 21, and the back side (second face) 1b of the wafer 1 is subjected to grinding (polishing). For example, this can be done by rotating the semiconductor wafer 1 held by the BG chuck table 21 and placing a rotating grinding wheel 23 into pressure contact with the wafer 1 while providing a supply of grinding water 22, such as pure water, to grind off (polish) the back side 1b of the wafer 1.

Figure 8:
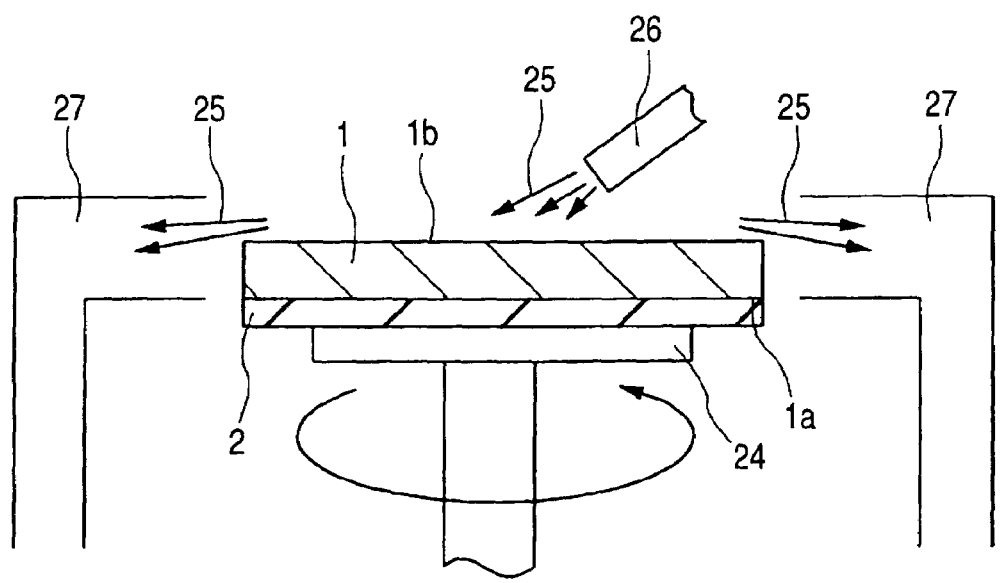
FIG. 8 is a diagram illustrates an etching step for a back side of the semiconductor wafer.

Next, if necessary, the back side 1b of the semiconductor wafer 1 is etched using an etching solution (step S4), whereby the wafer back side 1b is cleaned and flattened. FIG. 8 illustrates an etching step for the wafer back side 1b.

As shown in FIG. 8, the surface 1a side of the semiconductor wafer 1, with the protective tape 2 affixed thereto, is held by an etcher chuck table 24, and the back side 1b of the semiconductor wafer 1 is etched. For example, the etching is carried out by rotating the semiconductor wafer 1 held by the etcher chuck table 24 and supplying an etching solution 25, such as a mixed solution of hydrofluoric acid, and nitric acid from a nozzle 26 onto the back side 1b of the wafer to etch the back side 1b. The etching solution 25, thus fed onto the wafer back side 1b from the nozzle 26, is recovered from an etching solution recovery window 27. The etching step for the wafer back side 1b may be omitted.

Figure 9:
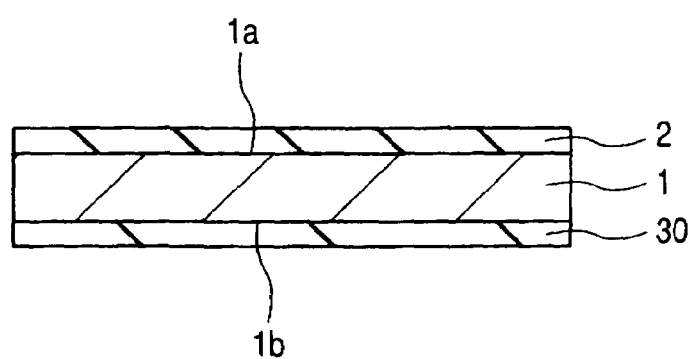
FIG. 9 is a sectional view showing a die bonding film affixed to the semiconductor wafer.

Then, a die bonding film 30 is affixed to the back side 1b of the semiconductor wafer (step S5). FIG. 9 is a sectional view showing the die bonding film 30 affixed to the semiconductor wafer 1. As will be described later, the die bonding film 30 functions as a bonding layer (adhesive layer) for die bonding each semiconductor chip after dicing the semiconductor wafer 1 into semiconductor chips (chips).

The step of affixing the die bonding film 30 to the back side 1b of the semiconductor wafer 1 will be described below in more detail with reference to FIGS. 10 to 12.

Figure 10:
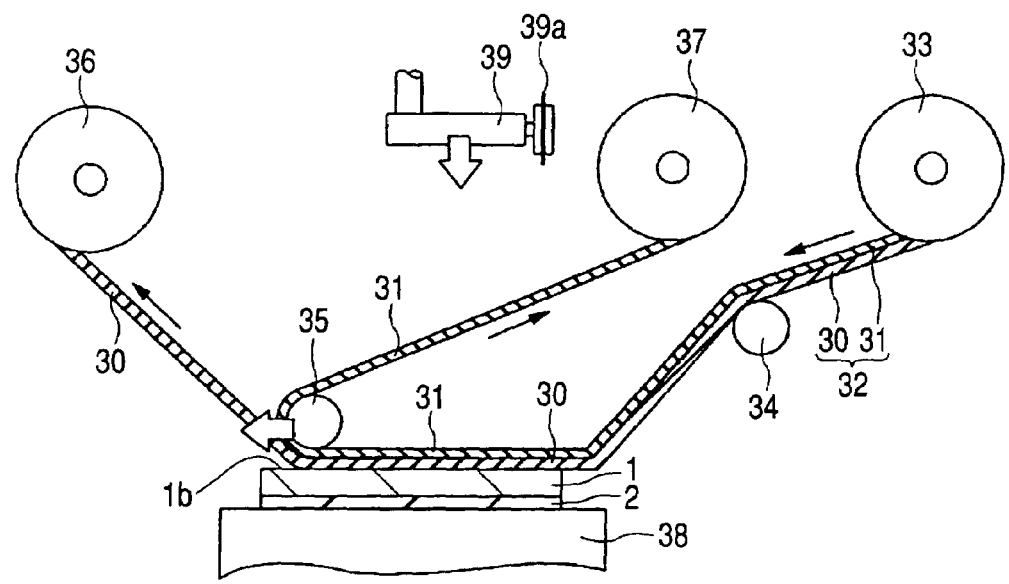
FIG. 10 is a diagram which illustrates a step of affixing the die bonding film to the back side of the semiconductor wafer.

As shown in FIG. 10, for affixing the die bonding film 30 to the wafer back side 1b, a sheet (laminate) 32 is used, which comprises the die bonding film 30 having a separator or a separator film 31 affixed thereto. For example, the separator film 31 is formed of polyester or PET. The separator film 31 is relatively rigid (hard) and has a stiffness, and it may be made relatively thick, e.g., 100 μm or so. The die bonding film 30 is formed using a thermoplastic resin material, e.g., polyimide, as a principal component. The die bonding film 30 is relatively thin and soft, the thickness of which may be set at, for example, 25 μm or so.

The sheet (laminate sheet) 32 comprising the die bonding film 30 and the separator film 31 is carried on a die bonding film delivery roll 33. The sheet 32 wound round the die bonding film delivery roll 33 is fed from the delivery roll 33 through rollers 34 and 35; and it is withdrawn from the roller 35, the die bonding film 30 is peeled or separated from the separator film 31. The die bonding film 30 is then wound round a die bonding film take-up roll 36, while the separator film 30 is wound round a separator take-up roll 37. The roller 35 is constructed so as to be movable laterally (in a direction parallel to the main surface of the semiconductor wafer 1), as seen in FIG. 10. The roller 35 moves laterally while pressing the sheet 32 onto the back side 1b of the semiconductor wafer 1 that is disposed on a table 38 (disposed in such a manner that the back side 1b of the wafer 1 faces upward), allowing the sheet 32 to be affixed onto the wafer back side 1b. At this time, care must be exercised so that the die bonding film 30 side of the sheet 32 comes into contact with the wafer back side 1b. That is, the sheet 32, comprising the die bonding film 30 and the separator film 31, is affixed to the wafer back side 1b in such a manner that the die bonding film 30 is positioned inside relative to the separator film 31.

Figure 11:
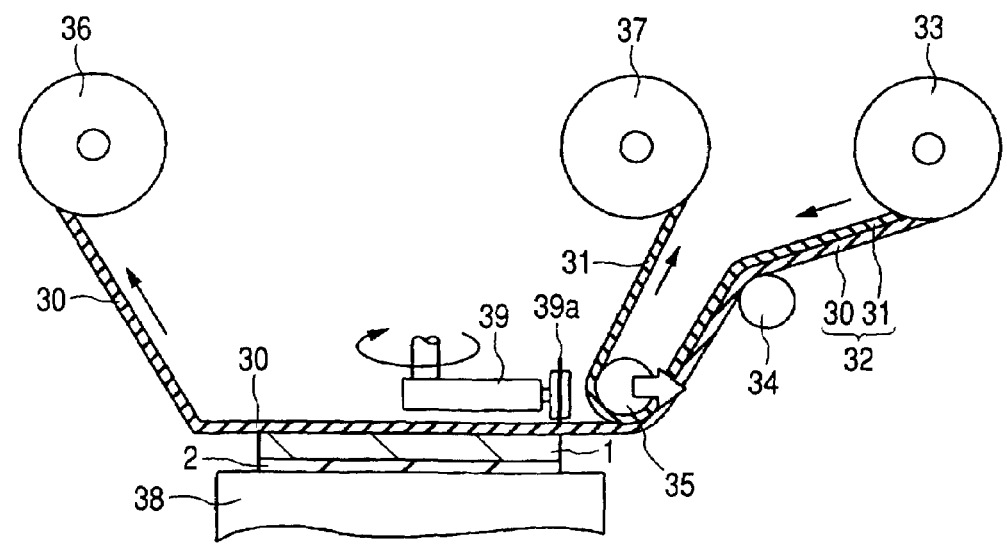
FIG. 11 is a diagram which illustrates a step in the semiconductor device manufacturing process which follows the step of FIG. 10.

Next, as shown in FIG. 11, the roller 35 moves (in a direction opposite to its moving direction for affixing the sheet 32), so that the separator film 31 is wound up by the separator take-up roll 37 while being peeled off from the die bonding film 30. As a result, only the die bonding film 30 remains present on the wafer back side 1b. Then, a sheet cutter 39 moves down onto the semiconductor wafer 1 and cuts the die bonding film 30 along the entire outer periphery (contour) of the semiconductor wafer 1 with use of blade 39a. In this cutting operation, the sheet cutter 39 rotates, so that the blade 39a of the sheet cutter 39 moves along the outer periphery of the semiconductor wafer 1 and cuts the die bonding film 30 along the outer periphery of the wafer.

Figure 12:
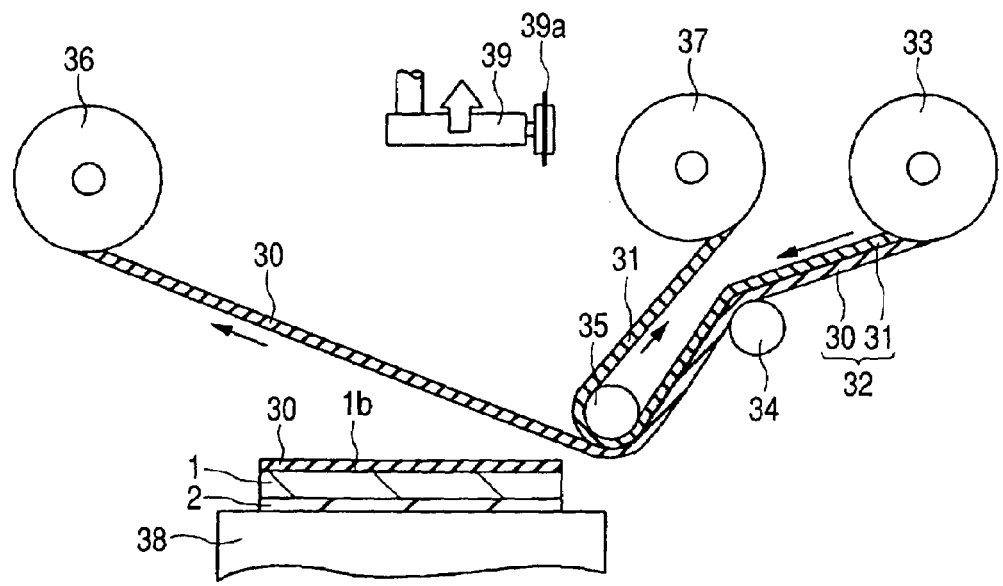
FIG. 12 is a diagram which illustrates a step in the semiconductor device manufacturing process which follows the step of FIG. 11.

After cutting the die bonding film 30, the sheet cutter 39 rises; and, as shown in FIG. 12, with a winding operation of the die bonding film take-up roll 36, the portion of the die bonding film 30, other than the portion bonded to the semiconductor wafer 1 (the die bonding film 30 in a gouged-out state missing the portion bonded to the wafer 1) is separated from the wafer 1 and is wound up on the die bonding film take-up roll 36. Thus, a portion of the die bonding film 30 will remain affixed (bonded) onto the back side 1b of the semiconductor wafer 1. Then, using a heater (not shown) (for example, a heater built within the table 38), the semiconductor wafer 1 is heated, allowing the wafer 1 and the die bonding film 30 to be bonded together temporarily. At this time, the heating temperature (first temperature) is relatively low and is, for example, 100° C. or so. Since the heating temperature for the temporary bonding of the semiconductor wafer 1 and the die bonding film 30 is relatively low, there is no fear of warping of the protective tape 2 affixed to the wafer surface 1a. Thus, it is possible to prevent warping of the semiconductor wafer 1. The term temporary bonding refers to a bonding which is effected using such a degree of bonding force that prevents the semiconductor wafer 1 and the die bonding film 30 from peeling off each other in subsequent steps (up to a heating step at a second temperature to be described later) or during conveyance during subsequent manufacturing steps. The heating step for the temporary bonding may be omitted if the adhesion between the die bonding film 30 and the semiconductor wafer 1 is ensured to some extent even without heating.

In this embodiment, as described above, the die bonding film 30, together with the separator film 31, is affixed to the back side 1b of the semiconductor wafer 1, and, thereafter, only the separator film 31 is peeled off and the die bonding film 30 is cut into a predetermined shape. If the die bonding film 30 alone is affixed onto the back side 1b of the semiconductor wafer 1, since the die bonding film 30 is relatively thin and soft, the die bonding film affixed to the wafer back side will tend to be wrinkled, and, hence, air bubbles are apt to enter the space between the die bonding film 30 and the semiconductor wafer 1. If such wrinkling of the die bonding film 30 that is affixed to the semiconductor wafer 1 or entry of air bubbles should occur, it will not be easy to peel off the die bonding film 30 (peel off the die bonding film 30 and re-affix another die bonding film to the wafer), resulting in the whole semiconductor wafer 1 becoming defective and no longer employable in the fabrication of the semiconductor device. This causes a marked lowering of the semiconductor device manufacturing yield and an increase of the semiconductor device manufacturing cost.

In this embodiment, since the die bonding film 30 is affixed to the back side 1b of the semiconductor wafer 1 together with the separator film 31, which is relatively hard and stiff, it is possible to prevent wrinkling of the die bonding film 30 that is affixed to the wafer back side 1b. It is also possible to prevent the entry of air bubbles between the semiconductor wafer 1 and the die bonding film 30. Besides, since the separator film 31 is peeled off before cutting the die bonding film 30, the thickness of the separator film 31 can be made relatively large. It is easy to make the separator film 31 relatively rigid (hard) to facilitate the prevention of wrinkling of the die bonding film 30. In this embodiment, moreover, since the die bonding film 30 contains a thermoplastic resin as a principal component, it is possible only for the separator film 31 to be peeled off after affixing the sheet 32 to the semiconductor wafer 1.

I the case where the die bonding film 30 is affixed to the back side 1b of the semiconductor wafer 1 after the protective tape 2 has been peeled-off from the semiconductor wafer 1, the wafer 1 will be warped as a result of the protective tape 2 having been peeled off from the wafer 1, and the die bonding film 30 will be affixed to the thus-warped wafer. Consequently, the die bonding film 30 that is affixed to the wafer back side 1b is apt to be wrinkled. In this embodiment, however, with the protective tape 2 affixed to the wafer surface 1a, the die bonding film 30 is affixed to the wafer back side 1b. Thus, the die bonding film 30 can be affixed to the wafer back side while warping of the wafer 1 is suppressed by the protective tape 2. Accordingly, it is possible to prevent more positively the occurrence of wrinkles in the die bonding film 30 that is affixed to the wafer back side 1b.

Figure 13:
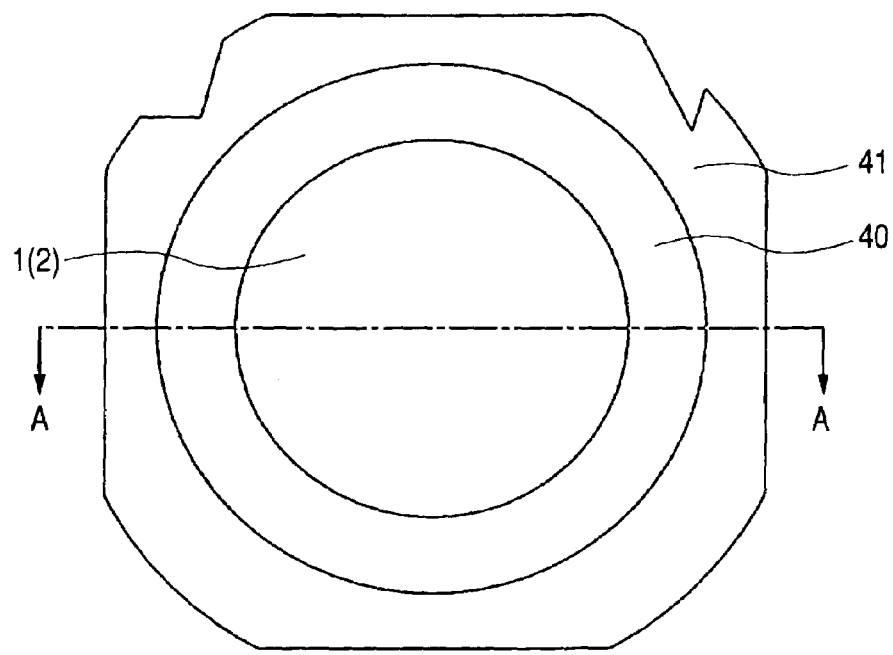
FIG. 13 is a plan view showing a dicing tape affixed to the semiconductor wafer.
Figure 14:
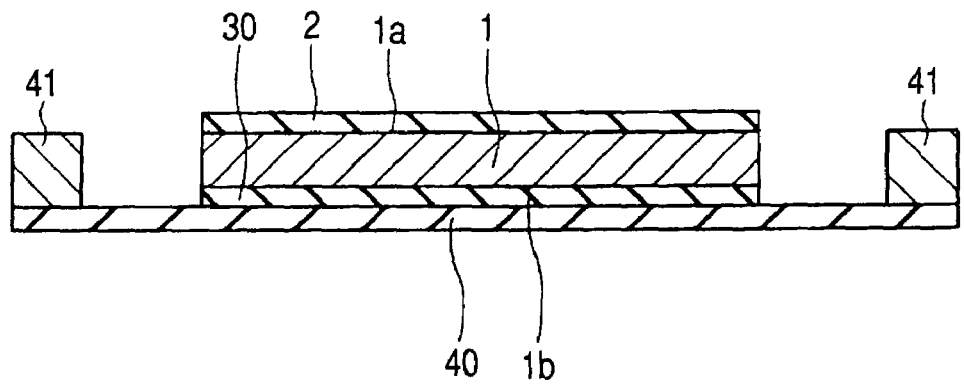
FIG. 14 is a sectional view taken on line A—A in FIG. 13.

After the die bonding film 30 has been affixed to the back side 1b of the semiconductor wafer 1, a dicing tape (wafer sheet) 40 is affixed to the wafer back side 1b (the face with the die bonding film 30 affixed thereto: second face) (wafer mounting: step S6). FIG. 13 is a plan view (top view) showing the dicing tape 40 affixed to the semiconductor wafer 1, and FIG. 14 is a sectional view taken on line A—A in FIG. 13.

The dicing tape 40 is a tape (sheet), one face of which has stickiness and extensibility, and the back side 1b of the semiconductor wafer 1 is affixed to the face having stickiness (sticky face). Therefore, the dicing tape 40 is affixed onto the die bonding film 30 lying on the wafer back side 1b. The dicing tape 40 is held by a holding jig (carrier jig, carrier ring, and frame: holding means) 41 disposed around the semiconductor wafer 1. For example, the holding jig 41 is formed of a metallic material (e.g., SUS) and is in the shape of a ring that is larger than the wafer 1. The dicing tape 40 functions to hold the cut pieces (semiconductor chips) after a dicing step for the wafer 1, which will be described later.

Figure 15:
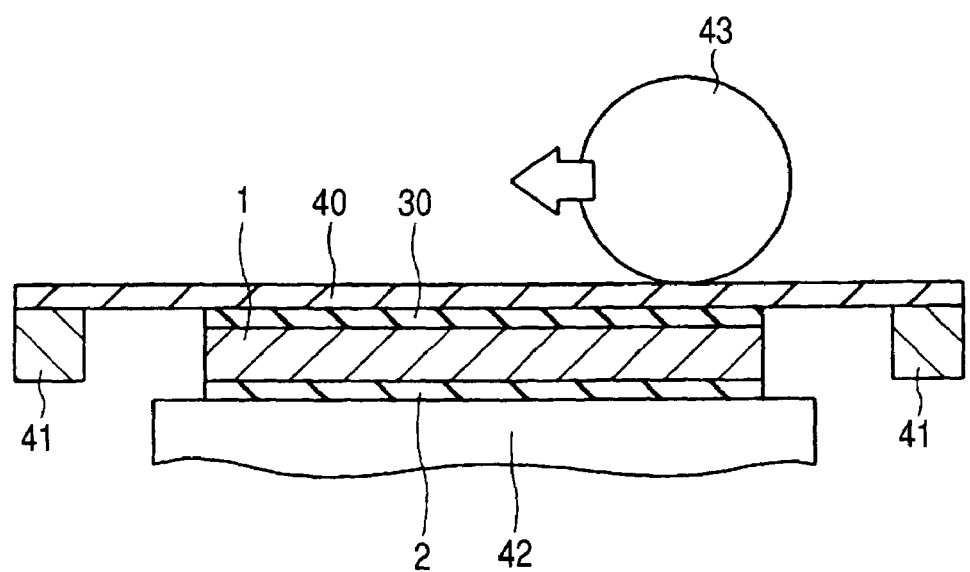
FIG. 15 is a sectional diagram which illustrates a step of affixing the dicing tape to the semiconductor wafer.

FIG. 15 illustrates a step of affixing the dicing tape 40 to the semiconductor wafer 1. As shown, the dicing tape 40 is affixed to the back side 1b of the semiconductor wafer 1 and a holding jig 41, which is larger than the wafer 1 and is ring-like, for example, is affixed around the wafer 1. In order to enhance the adhesion between the semiconductor wafer 1 and the dicing tape 40, the dicing tape 40 that is affixed to the back side 1b (die bonding film 30) of the wafer 1, which is disposed on a table 42, is pressed down with an affixing roller 43. The holding jig 41 may be affixed to the dicing tape 40 after affixing the semiconductor wafer 1 to the dicing tape 40; on the other hand, after affixing the dicing tape 40 to the holding jig 41, the wafer back side 1b may be affixed to the dicing tape 40 held by the holding jig 41.

Figure 16:
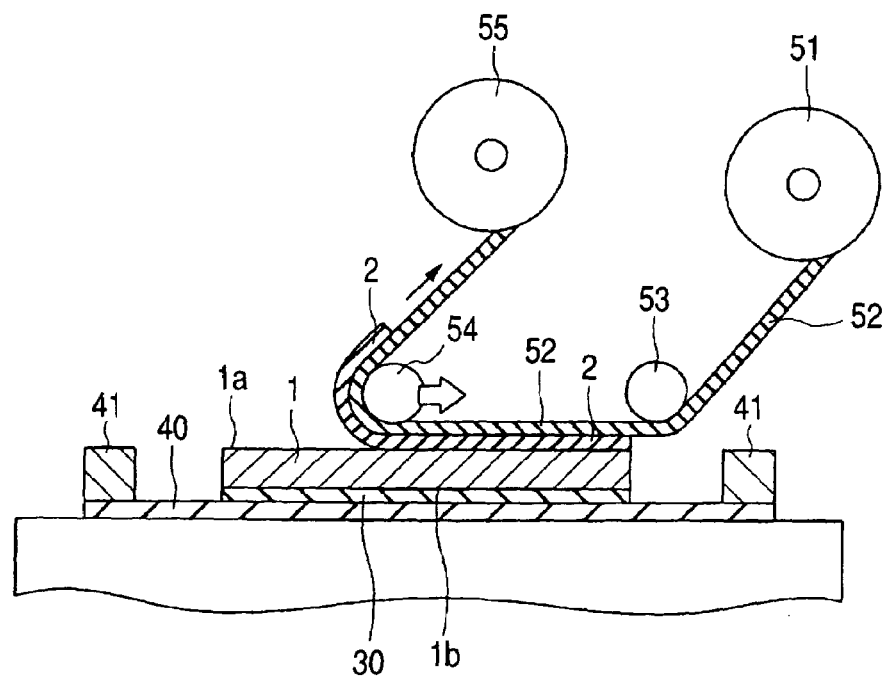
FIG. 16 is a diagram which illustrates a step of peeling off the protective tape from the semiconductor wafer.

Next, the protective tape 2 is peeled off from the surface 1a of the semiconductor wafer 1 (step S7). FIG. 16 illustrates a step of peeling the protective tape 2 from the semiconductor wafer 1.

As shown in FIG. 16, a release tape 52, which is wound round a release tape delivery roll 51, is delivered through rollers 53 and 54 and is wound up onto a release tape take-up roll 55. One face of the release tape 52 has high stickiness (stronger than that of the sticky face of the protective face 2), and this sticky face is pressed down and affixed to the outer surface of the protective tape 2 on the surface 1a of the semiconductor wafer 1 by means of the roller 54, which moves laterally (in a direction parallel to the main surface of the semiconductor wafer 1), as seen in FIG. 16. Then, the roller 54 moves (in a direction opposite to the direction for affixing the release tape 52), whereby the release tape 52 is wound up onto the release tape take-up roll 55. At this time, since the face of the release tape 52 in contact with the protective tape 2 has high stickiness, the protective tape 2 peels off from the semiconductor wafer 1 together with the release tape 52. Thus, the protective tape 2 can be peeled off from the wafer surface 1a, and, therefore, the wafer surface (semiconductor elements-formed face) 1a is exposed.

Figure 17:
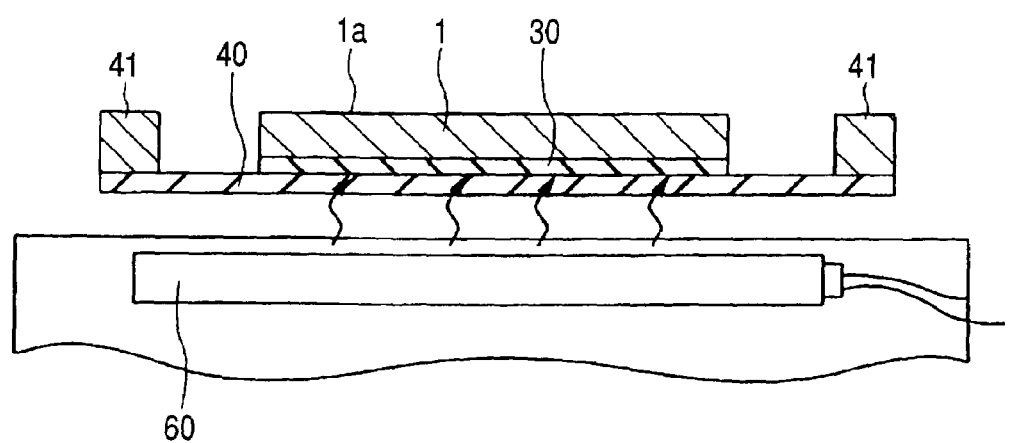
FIG. 17 is a diagram which illustrates a semiconductor wafer heating step.

Next, in order to enhance (improve) the adherence between the semiconductor wafer 1 and the die bonding film 30, the wafer 1 (the die bonding film 30) is heated to a second temperature (step S8). FIG. 17 illustrates a heating step for the semiconductor wafer 1.

As shown in FIG. 17, the semiconductor wafer 1 that is affixed to the dicing tape 40, which is held by the holding jig 41, is heated using a heater 60. At this time, the heating temperature (second temperature) is higher than the heating temperature (first temperature) which is used for temporarily bonding the semiconductor wafer 1 and the die bonding film 30 with each other, and it is about 80° C., for example (the heating time is, for example, 2 seconds or so). With this heating, the die bonding film 30, which contains a thermoplastic resin material as a principal component, softens and thereafter becomes hard (cures) by cooling, whereby the semiconductor wafer 1 and the die bonding film 30 come into close contact with each other.

Since this heating step is carried out at a relatively high temperature (second temperature: for example, 180° C.), warping of the semiconductor wafer 1 is apt to occur. Consequently, if heating to the second temperature is conducted after affixing the die bonding film 30 to the semiconductor wafer 1 and before affixing the dicing tape 40 thereto, there arises a fear that the wafer 1 will warp. If the warping occurs, it will cause cracking of the wafer 1 in subsequent steps or during conveyance. In this embodiment, the heating to the second temperature is performed after affixing the dicing tape 40. Thus, the heating to the second temperature is conducted in a state in which the semiconductor wafer 1 is affixed to the dicing tape 40 held by the holding jig 41. Since the dicing tape 40 held by the holding jig 41 holds (reinforces) the semiconductor wafer 1 which is affixed thereto, it is possible to surely prevent warping of the wafer in the heating step.

In this embodiment, moreover, since the protective tape 2 is peeled off before this heating step (heating at the second temperature), a highly heat-resistant material need not be used for the protective tape 2. For example, even if the protective tape 2 is formed using a material which is deformed at the second temperature, there is no fear that the semiconductor wafer 1 will be warped due to the protective tape 2, because the heating to the second temperature is performed in the absence (after peel-off) of the protective tape 2. The protective tape peeling step may be carried out after this heating step; and, in this case it is preferred that the protective tape 2 be formed using a material having a high heat resistance and which resists being deformed even at the second temperature. If the protective film 2 is formed using such a material, it is possible to prevent warping of the semiconductor wafer 1 caused by deformation of the protective film 2 or to prevent the protective tape 2 from becoming difficult to peel off. It is more preferable that the dicing tape 40 be formed using a material which can withstand (resists being deformed) the second temperature.

Figure 18:
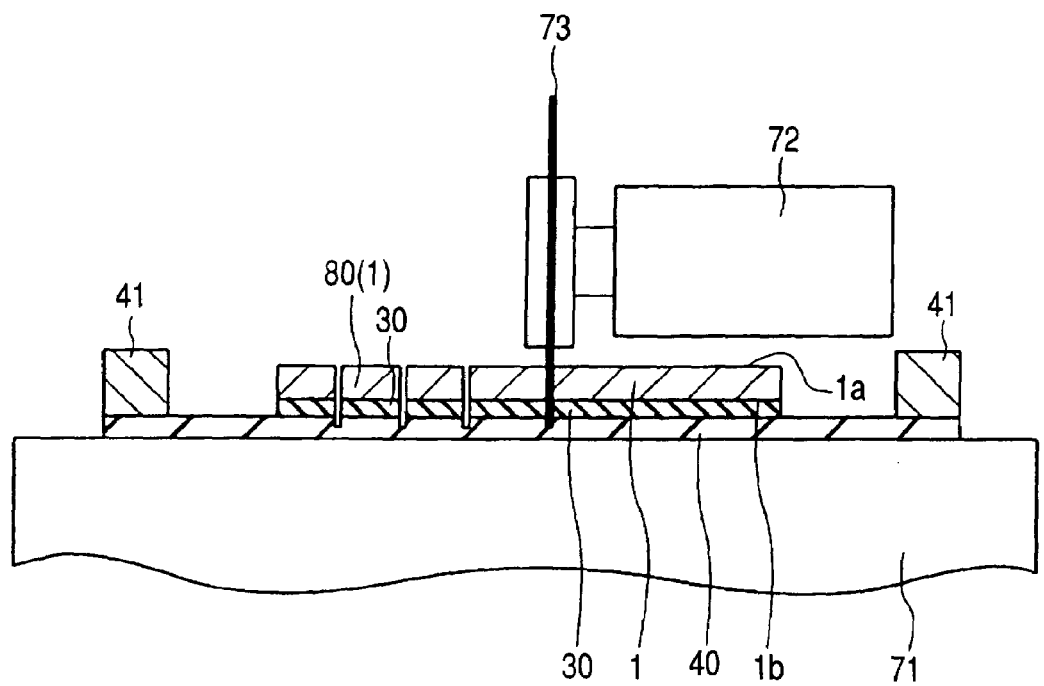
FIG. 18 is a diagram which illustrates a semiconductor wafer dicing step.

Next, the semiconductor wafer 1 is subjected to dicing (step S9). FIG. 18 illustrates a dicing step for the semiconductor wafer 1.

As shown in FIG. 18, the semiconductor wafer 1, that is affixed to the dicing tape 40, disposed on a table 71 and held by the holding jig 41, is diced or cut from it surface 1a side with use of a blade (dicing blade) 73, which is rotated at high speed by means of the spindle 72 of a dicing apparatus. On the semiconductor wafer 1, plural semiconductor elements (not shown) are formed, and the wafer 1 is diced along a scribing area (scribing line) between adjacent semiconductor element-formed areas. In FIG. 18, the dicing tape 40 is diced or cut halfway into its depth. As a result of dicing, the semiconductor wafer 1 is separated into chip areas (unit integrated circuit areas) or merely into chips (unit integrated circuits area or base portions thereof) or semiconductor chips (chips) 80, which are held by the dicing tape 40. The dicing depth also may be halfway of the die bonding film 30 or halfway of the semiconductor wafer 1. It is possible to adopt a dicing method such as a half-cut method, wherein the wafer 1 is diced to about half of its depth, a semi-full cut method, wherein the wafer 1 is diced, while allowing only a slight depth portion of the wafer to remain undiced, or a full-cut method, wherein the wafer 1 is cut completely.

Figure 19:
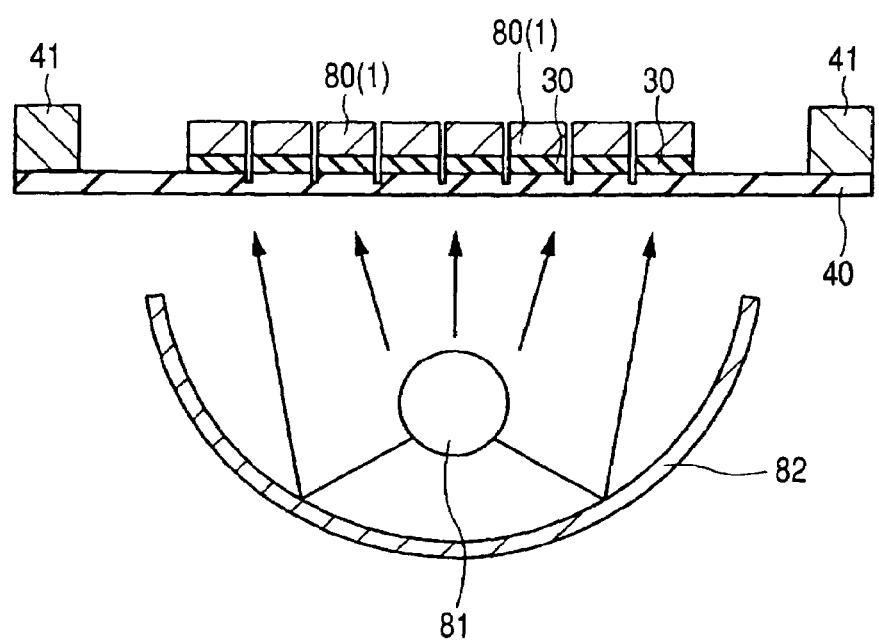
FIG. 19 is a diagram which illustrates a step of decreasing the adhesion of the dicing tape.

Next, a process for lowering the adhesion (stickiness) of the dicing tape 40 is carried out. For example, the dicing tape 40 can be made less adhesive by the application of ultraviolet light (UV) thereto (step S10). FIG. 19 illustrates the process for lowering the adhesion of the dicing tape 40.

As shown in FIG. 19, using a UV irradiator or a UV lamp (ultraviolet lamp) 81, ultraviolet light (UV) is applied to the diced semiconductor wafer 1 that is affixed to the dicing tape 40 and which is held by the holding jig 41. Ultraviolet light emitted from the UV lamp 81 is applied to the dicing tape 40 directly, or after being reflected by a reflector 82. In this embodiment, a material that is adapted to become less adhesive when exposed to ultraviolet light is used as the material of the dicing tape 40 (or the adhesive layer of the dicing tape 40). An example of such material is an ultraviolet curing resin. With this material, the bonding strength of the dicing tape 40, i.e., the strength of bonding between the dicing tape 40 and the die bonding film 30, can be lowered.

Figure 20:
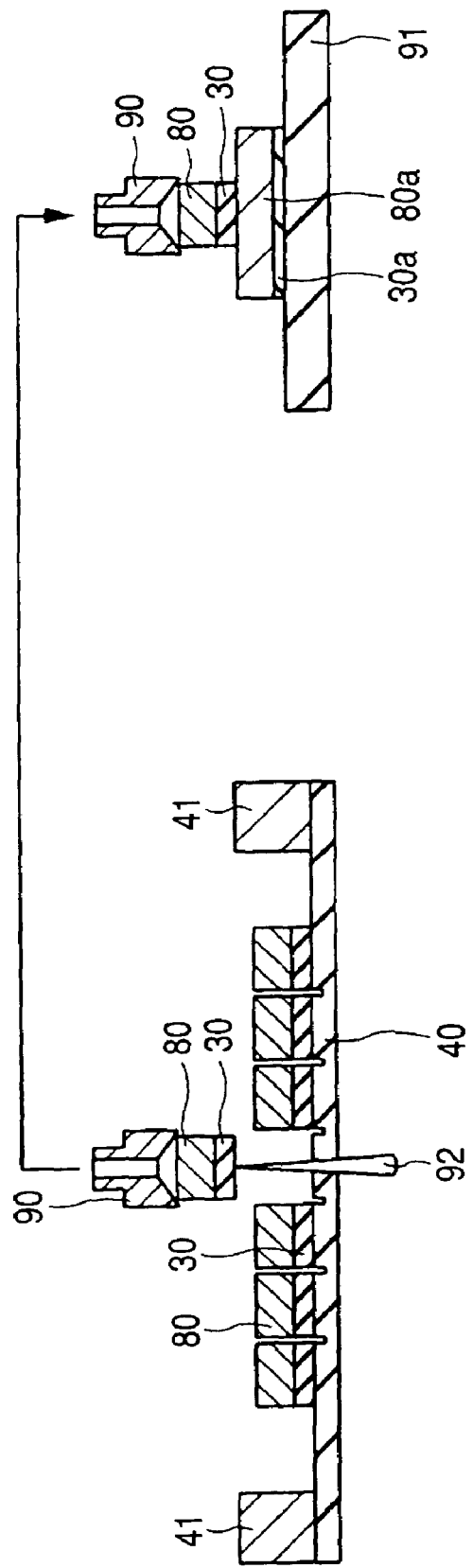
FIG. 20 is a diagram which illustrates a die bonding step for a semiconductor chip.

Next, the semiconductor chips (chips) 80 are subjected to die bonding (step S11). FIG. 20 illustrates a die bonding step for the semiconductor chips 80.

As described above, the semiconductor wafer 1 is separated into plural semiconductor chips 80 by the dicing step, and the chips 80 (as well as the die bonding film 30 affixed to the back side of each chip) are rendered less adhesive to the dicing tape 40 by ultraviolet radiation. As shown in FIG. 20, the semiconductor chip 80 is chucked using a collet 90 of a die bonder (a die bonding apparatus) and is disposed (mounted) at a predetermined position on a wiring substrate 91. To facilitate the chucking of each semiconductor chip 80 with the collet 91 at the diced semiconductor chip 1 and conveying the chip, a needle-like pin 92 is plunged up (chip plunge-up) from the back side (dicing tape 40 side) of the semiconductor wafer 1, causing the chip 80 to be separated and chucked. The semiconductor chip 80 is then disposed on the wiring substrate 91 in such a manner that its back side (the bonded side of the die bonding film 30: second face side) faces the wiring substrate 91 (lower side). Thus, the chip 80 is disposed on the wiring substrate 91 through the die bonding film 30.

In some cases only one semiconductor chip 80 will be mounted on the wiring substrate 91; however, as shown in FIG. 20, in other cases, another semiconductor chip (semiconductor device) 80 may be first disposed on the wiring substrate 91, after which the semiconductor chip 80 is disposed on the semiconductor chip 80a. The semiconductor chip 80a can be fabricated in the same way as the semiconductor chip 80, such that a die bonding film 30a, which is the same as the die bonding film 30, is affixed to the back side of the chip 80a. The number of semiconductor chips stacked (laminated) onto the wiring substrate 91 in this way may be an arbitrary number.

Next, the wiring substrate 91, with the semiconductor chips 80 and 80a mounted thereon, is heated to a predetermined temperature (for example, about 180° C.) (that is, the die bonding films 30 and 30a are heated) to soften the die bonding films 30 and 30a, thereby allowing the semiconductor chip 80 to be bonded to the semiconductor chip 80a through the die bonding film 30 and allowing the semiconductor chip 80a to be bonded to the wiring substrate 91 through the die bonding film 30a. Thereafter, cooling is performed to harden the die bonding films 30 and 30a, allowing the semiconductor chip 80 to be fixed to the semiconductor chip 80a through the die bonding film 30 and allowing the semiconductor chip 80a to be fixed to the wiring substrate 91 through the die bonding film 30a. In the case where the semiconductor chip 80 is mounted directly on the wiring substrate 91, the die bonding film 30 is heated and softened, then it is cooled and hardens, whereby the semiconductor chip 80 is fixed directly to the wiring substrate 91 through the die bonding film 30.

If the die bonding of the semiconductor chip is performed using silver paste or the like, without using the die bonding film 30, since an adhesive such as silver paste, which contains an organic solvent, is applied to the back side of the semiconductor chip, there is a fear that the organic solvent may vaporize and diffuse within a clean room, thus giving rise to a problem from the point of view of maintaining an acceptable working environment. Besides, the manufacturing process becomes complicated because an adhesive such as silver paste is applied to the back of the semiconductor chip, followed by bonding to the wiring substrate, and this also results in a consequent increase in the semiconductor chip manufacturing cost. As described above, in the case where another semiconductor chip is mounted onto the semiconductor chip (in case of stacking plural semiconductor chips), silver paste for bonding the overlying semiconductor chip to the underlying semiconductor chip is likely to spread to the electrode pads, which tends to deteriorate the reliability of the semiconductor device. In this embodiment, die bonding of the semiconductor chip 80 is carried out using the die bonding film 30, so that the problem associated with the working environment is eliminated; besides, the operability is improved and the manufacturing process is simplified. It is also easy to stack plural semiconductor chips. Consequently, the reliability of the semiconductor device is improved. Further, the semiconductor device manufacturing yield is improved, and it becomes possible to reduce the semiconductor device manufacturing cost.

Figure 21:
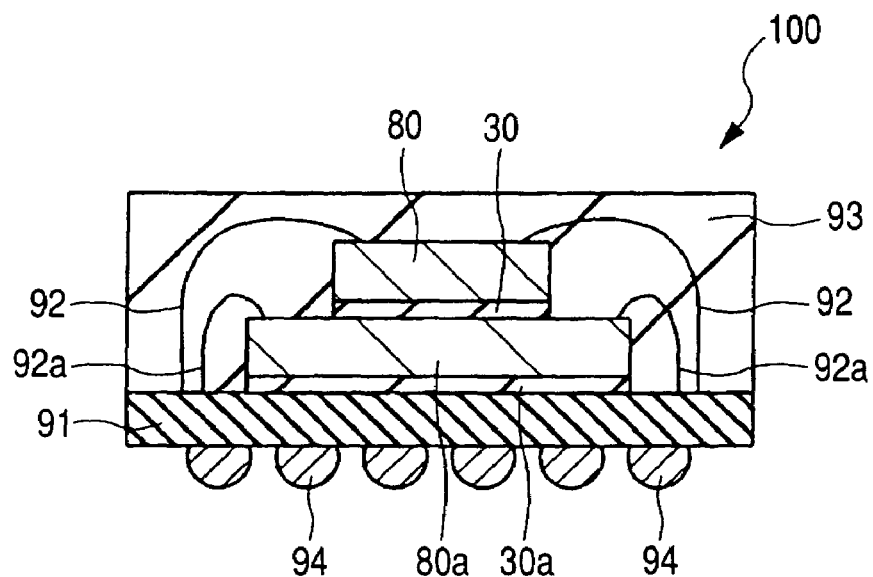
FIG. 21 is a sectional view of the semiconductor device according to the above embodiment.

As shown in FIG. 21, after the die bonding step described above, electrode pads on the surfaces of the semiconductor chips 80 and 80a and wiring on the wiring substrate 91 are mutually connected electrically through bonding wires 92 and 92a. Then sealing resin (molding resin) 93 is formed on the wiring substrate 91 so as to cover the semiconductor chips 80, 80a and the bonding wires 92, 92a, and solder balls 94 or the like are formed as external connecting terminals on the bottom of the wiring substrate 91, followed by cutting the wiring substrate 91 if necessary. In this way, a semiconductor device 100 of this embodiment is fabricated as shown in FIG. 21.

The semiconductor device 100 shown in FIG. 21 is fabricated on the wiring substrate 91 in the same way as the semiconductor chip 80 and it is a two-stage stack type semiconductor device wherein the semiconductor chip 80 and the semiconductor chip 80a; having different external dimensions from the semiconductor chip 80, are stacked on the wiring substrate 91. The semiconductor chips 80 and 80a may be semiconductor chips formed with various semiconductor elements as necessary. For example, the underlying (lower-stage) semiconductor chip 80a may be a SRAM of 8M and the overlying (upper-stage) semiconductor chip 80 may be a SRAM of 4M. In the semiconductor device 100 shown in FIG. 21, both overlying and underlying semiconductor chips 80, 80a are electrically connected to (wires on) the wiring substrate 91 through bonding wires 92 and 92a, but the underlying semiconductor chip 80a may be electrically connected to (wires on) the wiring substrate 91 by flip chip connection, for example.

In a semiconductor device (multi-stage stack type semiconductor device) having a plurality of stacked semiconductor chips, as described above, for example, it is necessary to make the thickness of each semiconductor chip relatively small in order to suppress an increase in thickness of the semiconductor device caused by the stacking of plural semiconductor chips. For example, in the semiconductor device 100 shown in FIG. 21, the length and width are each 6.5 mm or so, the size in the thickness direction is about 1.4 mm, and the thickness of each of the semiconductors 80 and 80a is about 150 μm. For fabricating such relatively thin semiconductor chips 80 and 80a, it is necessary to reduce the thickness of the semiconductor wafer (for example to 150 μm or so). However, if the thickness of the semiconductor wafer is reduced by back grinding, for example, the wafer becomes more susceptible to warping and is, therefore, cracked or chipped easily, resulting in the semiconductor device manufacturing yield being decreased. In this embodiment, after the step of affixing the protective tape 2 to the semiconductor wafer 1 and up to the dicing step, the semiconductor wafer 1 is in a state where it is held (fixed or reinforced) by the dicing tape 40, and thus it is possible to suppress or prevent warping of the wafer 1. In this embodiment, moreover, the die bonding film 30 is affixed to the back side 1b of the semiconductor wafer 1 while the protective tape 2 is affixed to the surface 1a of the semiconductor wafer; and, after the wafer 1 is affixed and secured to the dicing tape 40 (held by the holding jig 41), heating is conducted for improving the adherence (adhesion) between the wafer 1 and the die bonding film 30, so that warping of the wafer 1 caused by heating is prevented. Therefore, even if the semiconductor wafer 1 is made thin by back grinding, the wafer 1 has little tendency to warp, and, thus, it is possible to prevent cracking or chipping of the wafer in each manufacturing step or during conveyance between manufacturing steps. Consequently, it is possible to improve the manufacturing yield of semiconductor chips (semiconductor devices) that have been fabricated from the semiconductor wafer 1 and of the semiconductor devices with semiconductor chips mounted thereon, thus permitting reduction of their manufacturing cost. It becomes also possible to reduce the size and thickness of each semiconductor device.

Figure 22:
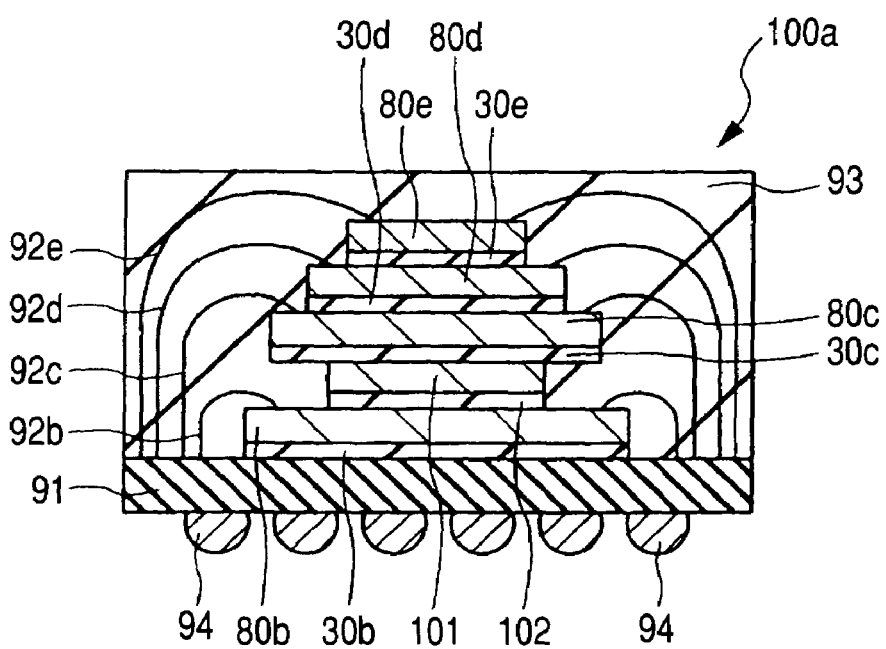
FIG. 22 is a sectional view of a semiconductor device according to another embodiment of the present invention.

FIG. 22 shows a four-stage stack type semiconductor device 100a with four semiconductor chips 80b to 80e stacked thereon. The semiconductor chips 80b to 80e that are stacked on the wiring substrate 91 can be fabricated in the same way as the semiconductor chip 80 and are subjected to die bonding with use of die bonding films 30b to 30e, which are the same as the die bonding film 30.

In the semiconductor device 100a shown in FIG. 22, the semiconductor chip 80b is mounted on the wiring substrate 91, a spacer 101 is mounted on the semiconductor chip 80b, and the semiconductor chips 80c to 80e are mounted in this order onto the spacer 101. Electrode pads on the semiconductor chips 80b to 80e are electrically connected to electrode pads on the wiring substrate 91 through bonding wires 92b to 92e. The semiconductor chips 80b to 80e may be semiconductor chips formed with various semiconductor elements as necessary. For example, the semiconductor chip 80b may be a flash memory of 64M, the semiconductor chip 80c may be a flash memory of 32M, the semiconductor chip 80d may be a SRAM of 8M, and the semiconductor chip 80e may be a PSRAM of 32M. The spacer 101 may be, for example, a chip obtained by dicing a semiconductor element-free semiconductor wafer into a predetermined shape. The spacer 101 is mounted on the semiconductor chip 80b through a die bonding film 102.

For example, in order to prevent the bonding wires 92b that are connected to the semiconductor chip 80b from contacting the semiconductor chip 80c, the spacer 101 is inserted between both chips 80b and 80c and has external dimensions smaller than the chips 80b and 80c. The insertion of the spacer 101 between the semiconductor chips 80b and 80c is effective for example in the case where the external dimensions of the chip 80b and those of the chip 80c are similar to each other.

The semiconductor device 100a is, for example, about 10 mm long, 11.5 mm wide, and 1.4 mm thick. Since the semiconductor device 100a shown in FIG. 22 has a larger number of stacked semiconductor chips (and spacer) than the semiconductor device 100 shown in FIG. 21, the semiconductor chips 80b to 80e and the spacer 101 are relatively thin and are each about 90 μm thick, for example. Therefore, in case of fabricating the semiconductor device 100a (semiconductor chips 80b to 80e), it is necessary to back-grind the semiconductor wafer to a greater extent (for example, to about 90 μm). According to the semiconductor device fabricating method of the present invention, even in the case where the semiconductor wafer is made extremely thin, it is possible to prevent warping and cracking of the wafer, and, hence, it is possible to improve the manufacturing yield of the semiconductor chips that have been fabricated from the wafer and of semiconductor devices using the chips. Accordingly, it is possible to reduce the cost of fabrication of the semiconductor chips and semiconductor devices.

The manufacturing process of this embodiment is suitable for the fabrication of relatively thin semiconductor chips (semiconductor devices); for example, it is suitable in case of fabricating semiconductor chips (semiconductor devices) that are about 200 μm or less in thickness by grinding a semiconductor wafer to a thickness of about 200 μm or less. If the thickness of a semiconductor wafer is about 200 μm or less, the wafer is apt to warp; however, according to this embodiment, it is possible to suppress warping of the semiconductor wafer in the fabrication of a semiconductor device. Also, in case of fabricating a semiconductor device by stacking plural semiconductor chips (on a wiring substrate or the like), the application of the semiconductor device manufacturing process according to this embodiment is very effective because each semiconductor chip is relatively thin.

Although the present invention has been described above by way of various embodiments thereof, it goes without saying that the present invention is not limited to the above-described embodiments, but that various changes may be made within a scope not departing from the gist of the invention.

The following is a brief description of effects obtained by typical modes of the invention disclosed herein.

A protective tape is affixed to a first face of a wafer; a second face of the wafer lying on the side opposite to the first face is subjected to grinding; a die bonding film is affixed to the second face of the wafer; a dicing tape is affixed onto the die bonding film on the second face of the wafer; then the protective tape is peeled off from the first face of the wafer; and the water is subjected to dicing, whereby it is possible to prevent warping of the wafer.

A laminate of a die bonding film and a separator film is affixed to the back side of the wafer so that the die bonding film faces inside; then, the separator film is peeled off, and the die bonding film is cut along the outer periphery of the wafer, whereby it is possible to prevent wrinkling of the die bonding film.

What is claimed is:

1. A method of fabricating a semiconductor device, comprising the steps of:
    (a) providing a wafer having a plurality of semiconductor elements formed thereon;
    (b) affixing a protective tape to a first face of the wafer;
    (c) grinding a second face of the wafer opposite to the first face;
    (d) affixing a die bonding film to the second face of the wafer, wherein the die bonding film is affixed by pressing a laminated film of the die bonding film and a separator from the back side of the separator film so that the die bonding film faces the second face of the wafer;
    (e) affixing a dicing tape over the die bonding film on the second face of the wafer;
    (f) peeling off the protective tape from the first face of the wafer; and
    (g) dicing the wafer.

2. The method according to claim 1,
    wherein the die bonding film contains a thermoplastic resin material.

3. The method according to claim 1,
    wherein the first face of the wafer is a face on which the plural semiconductor elements are formed.

4. The method according to claim 1,
    wherein the die bonding film functions as an adhesive layer at the time of die-bonding chips obtained by dicing the wafer.

5. The method according to claim 1, further comprising a step of heating the die bonding film after the step (e) and before the step (f).

6. The method according to claim 1, further comprising a step of heating the die bonding film after the step (f) and before the step (g).

7. The method according to claim 1, further comprising, after the step (e) and before the step (f), a step of heating the die bonding film for improving the adherence between the die bonding film and the wafer.

8. The method according to claim 1, further comprising, after the step (f) and before the step (g), a step of heating the die bonding film for improving the adherence between the die bonding film and the wafer.

9. The method according to claim 1, further comprising the steps of:
heating the die bonding film to a first temperature after the step (d) and before the step (e); and
heating the die bonding film to a second temperature higher than the first temperature after the step (e) and before the step (f).

10. The method according to claim 1, further comprising the steps of:
heating the die bonding film to a first temperature after the step (d) and before the step (e); and
heating the die bonding film to a second temperature higher than the first temperature after the step (f) and before the step (g).

11. The method according to claim 1,
wherein, in the step (e), the dicing tape is held by a holding means disposed around the wafer, and
wherein, in the step (g), the wafer affixed to the dicing tape held by the holding means is diced.

12. The method according to claim 1,
wherein, in the step (c), the wafer is ground to a thickness of not larger than 200 μm.

13. The method according to claim 1,
wherein in the step (d) the laminated film of the die bonding film and the separator film is applied to the second face of the wafer in such a manner that the die bonding film faces inside; and the step (d) further includes:
peeling off the separator film; and
cutting the die bonding film along an outer periphery of the wafer.

14. The method according to claim 1, wherein the protective tape is peeled off from the first face of the wafer after affixing the dicing tape over the die bonding film on the second face of the wafer.

15. The method according to claim 1, wherein the protective tape is peeled off from the first face of the wafer after affixing the die bonding film to the second face of the wafer.

16. The method according to claim 1, wherein said separator film is made of a material selected from the group consisting of polyester and poly (ethylene terephthalate).

17. The method according to claim 16, wherein said die bonding film is made of thermoplastic resin material.

18. The method according to claim 13, wherein the separator film is peeled off prior to said cutting the die bonding film.

19. A method of fabricating a semiconductor device, comprising the steps of:
(a) providing a wafer having a plurality of semiconductor elements formed thereon;
(b) affixing a protective tape to a first face of the wafer;
(c) grinding a second face of the wafer opposite to the first face;
(d) affixing a die bonding film to the second face of the wafer;
(e) affixing a dicing tape over the die bonding film on the second face of the wafer;
(f) peeling off the protective tape from the first face of the wafer; and
(g) dicing the wafer, and
further comprising the steps of:
heating the die bonding film to a first temperature after the step (d) and before the step (e); and
heating the die bonding film to a second temperature higher than the first temperature after the step (e) and before the step (f).

20. A method of fabricating a semiconductor device, comprising the steps of:
(a) providing a wafer having a plurality of semiconductor elements formed thereon;
(b) affixing a protective tape to a first face of the wafer;
(c) grinding a second face of the wafer opposite to the first face;
(d) affixing a die bonding film to the second face of the wafer;
(e) affixing a dicing tape over the die bonding film on the second face of the wafer;
(f) peeling off the protective tape from the first face of the wafer; and
(g) dicing the wafer, and
further comprising the steps of:
heating the die bonding film to a first temperature after the step (d) and before the step (e); and
heating the die bonding film to a second temperature higher than the first temperature after the step (f) and before the step (g).

* * * * *